United States Patent [19]
Alvarez et al.

[11] Patent Number: 4,927,775
[45] Date of Patent: May 22, 1990

[54] METHOD OF FABRICATING A HIGH PERFORMANCE BIPOLAR AND MOS DEVICE

[75] Inventors: Antonio R. Alvarez, Sunnyvale, Calif.; James A. Kirchgessner, Mesa, Ariz.

[73] Assignee: Motorola Inc., Schaumburg, Ill.

[21] Appl. No.: 319,387

[22] Filed: Mar. 6, 1989

[51] Int. Cl.$^5$ .................. H01L 21/28; H01L 21/22
[52] U.S. Cl. ........................... 437/31; 437/56; 437/57; 437/162; 437/200; 357/43
[58] Field of Search ............... 437/31, 56, 57, 162, 437/200, 56; 357/34, 35, 43; 148/DIG. 147, DIG. 124

[56] References Cited

U.S. PATENT DOCUMENTS 4,438,556 3/1984 Komatsu et al. .................. 437/31
4,764,480 8/1988 Vora ................................. 437/56

FOREIGN PATENT DOCUMENTS 0168324 1/1986 European Pat. Off. .
0199061 10/1986 European Pat. Off. .

OTHER PUBLICATIONS

"Is BiCMos the Next Technology Driver?" by Bernard C. Cole, Electronics, Feb/1988, pp. 55–57.
"Self-Aligned Transistors with Polysilicon Emitters for Bipolar VLSI" by Cuthbertson et al., IEEE Electron Devices, vol. ED-32, No. 2, Feb. 1985, pp. 242–247.

Primary Examiner—Brian E. Hearn
Assistant Examiner—Tuan Nguyen
Attorney, Agent, or Firm—Joe E. Barbee; Miriam Jackson

[57] ABSTRACT

An improved method of fabricating a high performance bipolar and MOS integrated circuit is provided. The method utilizes a single polysilicon layer, a self-aligned emitter-base structure, self-aligned silicide contacts, and silicon dioxide sidewall spacers to obtain reduced emitter and base resistance, reduced collector to base capacitance, greater switching speed, and a higher packing density. The method also has the advantage of being simple and compatible with a method of fabricating MOS devices which improves performance and yield.

3 Claims, 2 Drawing Sheets

METHOD OF FABRICATING A HIGH PERFORMANCE BIPOLAR AND MOS DEVICE

BACKGROUND OF THE INVENTION

This invention relates, in general, to the manufacture of semiconductor devices, and more particularly, to a method of fabricating high performance bipolar and MOS devices with improved density and performance.

The fabrication of bipolar integrated circuits has gone to silicide technology, planarized metal interconnects and sidewall spacers in order to improve the device characteristics of bipolar integrated circuits. These methods have improved packing density, performance and yield, among other things. Any further improvements which simplify the process and improve device characteristics will be desirable.

It is also desirable to fabricate bipolar devices and MOS devices on a single chip for making high speed SRAMS, microprocessors, ASIC devices and analog/digital integrated devices. Two of the problems faced here are: (1) typically the performance of one of the devices is compromised for the other, and (2) the incompatibility of the process steps for each device not only complicates the fabrication process, but also decreases the yield. Thus there is a need to provide an improved method of fabricating bipolar and MOS devices on the same semiconductor chip, so that the yield and performance of the bipolar and the MOS devices is optimized.

By now it should be appreciated that it would be advantageous to provide an improved and simplified method of fabricating high performance bipolar transistors that is also compatible with a method of fabricating MOS transistors.

Accordingly, it is an object of the present invention to provide an improved, simple method of fabricating high performance bipolar devices and MOS devices which is easily scalable.

Another object of the present invention is to provide an improved method of fabricating a bipolar device having reduced base and emitter resistances, and reduced collector-base capacitance.

A further object of the present invention is to provide an improved method of fabricating a high performance bipolar device having greater switching speed.

Yet another object of the present invention is to provide an improved method of fabricating a bipolar device with sidewall spacers, a self-aligned emitter-base structure, and minimum emitter to extrinsic base spacing thereby reducing base resistance and allowing for a higher density of integration.

Still a further object of the present invention is to provide an improved method of fabricating bipolar devices that is compatible with a method of fabricating MOS devices.

SUMMARY OF THE INVENTION

In accordance with the present invention, the above and other objects and advantages are provided by a new method of fabricating a bipolar device utilizing a single polysilicon layer, a self-aligned emitter-base structure, self-aligned silicide contacts, and silicon dioxide sidewall spacers, thereby improving device characteristics and yield. This process is also compatible with MOS technology.

The preferred embodiments of the invention are illustrated in the accompanying drawings for purposes of exemplification, and are not to be construed as limiting in any manner.

DETAILED DESCRIPTION OF THE DRAWINGS

Figure 1:
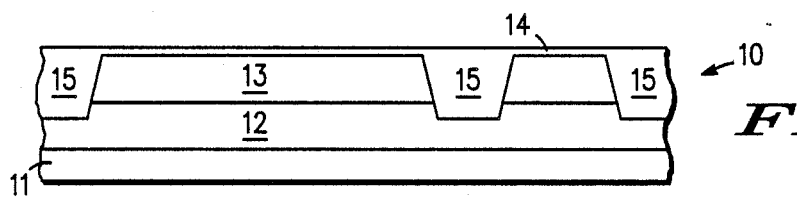
FIGS. 1-9 illustrate enlarged, cross-sectional views of a bipolar device during various stages of fabrication using a first embodiment of the present invention.

FIG. 1 illustrates an enlarged cross-sectional view of a semiconductor device 10 in an early stage of fabrication. What is shown is a substrate 11, a buried layer 12, an epitaxial layer 13, and field oxide isolation regions 15 which all have been formed by conventional techniques known by those skilled in the art. Other methods of isolation may also be used. In a preferred embodiment, substrate 11 would be of a P-type conductivity, buried layer 12 would be of an N-type conductivity, and epitaxial layer 13 would also be of an N-type conductivity. A thin screen oxide 14 is used to protect the surface of epitaxial layer 13 from ion implant damage.

Figure 2:
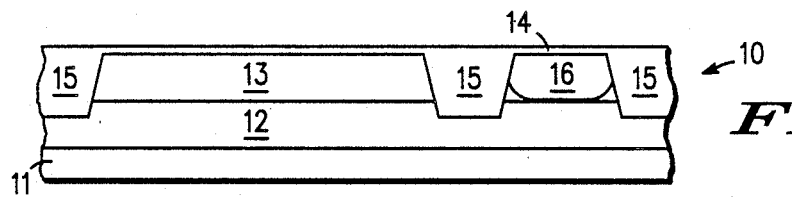

FIG. 2 illustrates the structure of FIG. 1 after a collector region 16 is formed in epitaxial layer 13 between two isolation regions 15. Collector region 16 is typically formed by ion implantation of an N-type dopant and a subsequent anneal. Collector region 16 makes contact to buried layer 12, which also acts as a collector region.

Figure 3:
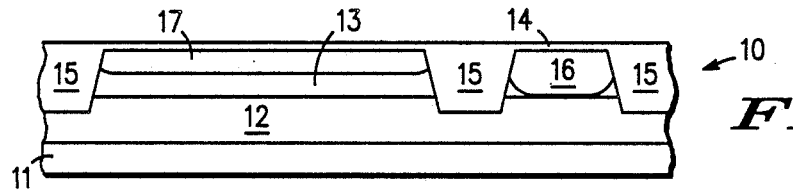

FIG. 3 illustrates the structure of FIG. 2 after a P-type intrinsic base region 17 is implanted and annealed into layer 13 between the other isolated regions 15 of device 10. In a preferred embodiment, boron is used at a level of approximately $1 \times 10^{13}$ to $4 \times 10^{13}$ atoms/cm$^2$ and subsequently annealed to drive base region 17 to a depth of approximately 0.15–0.30 microns below the surface. In a second embodiment base region 17 may also be formed by implanting a P-type dopant into polysilicon layer 18 (illustrated in FIG. 4) and then diffusing into layer 13.

Figure 4:
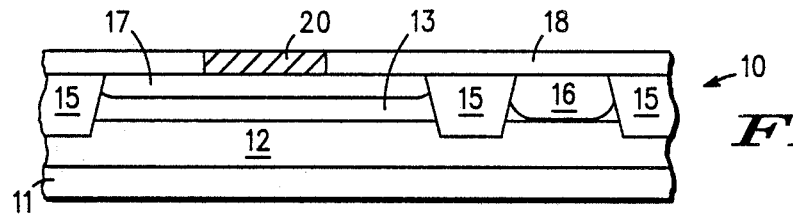

FIG. 4 illustrates the structure of FIG. 3 after a polysilicon layer 18 is deposited on the surface of device 10. The thin screen oxide 14 is removed before the deposition of polysilicon layer 18. In addition, a dopant is added to a selected portion of polysilicon layer 18 thereby forming polysilicon emitter region 20. In a preferred embodiment, polysilicon emitter region 20 is doped with a heavy dose of arsenic in the range of approximately $1 \times 10^{15}$ to $2 \times 10^{16}$ atoms/cm$^2$. As will be seen later, the dopant will be utilized in two ways.

Figure 5:
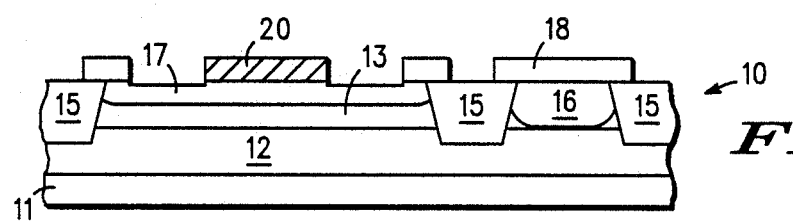

FIG. 5 illustrates the structure of FIG. 4 after portions of polysilicon layer 18 are removed by using conventional photolithography and silicon etch techniques that are very well known in the art. Note that a slight over-etch is used to etch down into intrinsic base region 17.

Figure 6:
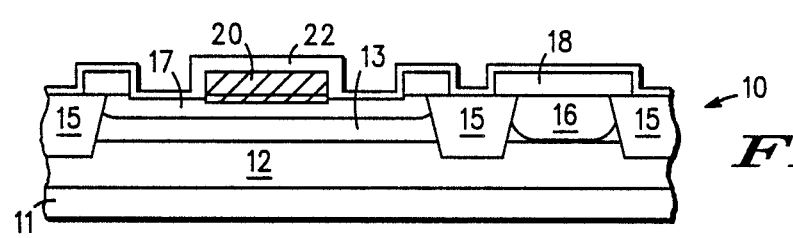

FIG. 6 illustrates the structure of FIG. 5 after a silicon dioxide layer 22 is grown on the surface of device 10. Silicon dioxide layer 22 is thermally grown, preferably in a steam ambient and at a temperature of approximately 800° C. As is shown in FIG. 6, silicon dioxide 22 grows at a faster rate over the heavily doped polysilicon emitter 20 than over undoped polysilicon layers 18, the exposed portions of base regions 17 and field oxide regions 15. For example, approximately 2500 to 3500 angstroms of silicon dioxide 22 is grown over polysilicon emitter region 20 and approximately 400 to 500 angstroms is grown over exposed base regions 17, field oxide regions 15, and undoped polysilicon layers 18. At this time, an anneal is performed to drive-in the arsenic located in polysilicon emitter region 20, thereby extending emitter region 20 into base region 17. It may be desirable to deposit a layer of silicon nitride (not shown) on polysilicon layer 20, prior to patterning, to prevent the thick layer of silicon dioxide 22 from forming on top of polysilicon layer 20. A thick layer of silicon dioxide 22 would still form on the sides of polysilicon layer 20.

Figure 7:
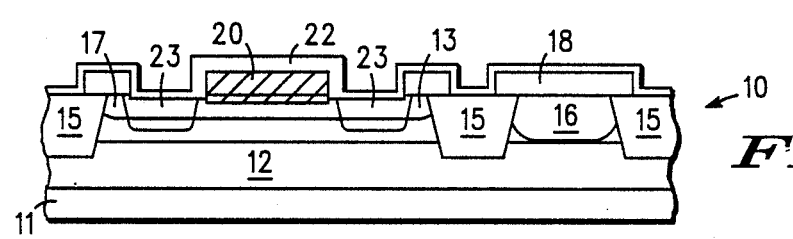

FIG. 7 illustrates the structure of FIG. 6 after an extrinsic base 23 is implanted into a portion of intrinsic base region 17 and subsequently annealed. In a preferred embodiment, boron is used at a dopant level of approximately $1 \times 10^{14}$ to $1 \times 10^{16}$ atoms/cm$^2$. An ion implantation step may also be done before silicon dioxide layer 22 is grown. The formation of extrinsic base 23 is optional, and therefore will not be illustrated in further figures. However, the formation of extrinsic base 23 may be desirable to reduce the base resistance of device 10.

Figure 8:
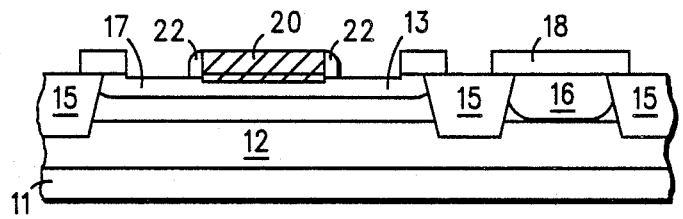

FIG. 8 illustrates the structure of FIG. 7 after a silicon dioxide etch is performed. Adjacent to the heavily doped polysilicon emitter 20, a portion of silicon dioxide layer 22 remains, thereby forming silicon dioxide sidewall spacers 22 (a term which is well known in the art). The silicon dioxide etch is preferably performed by using an anisotropic etch, an isotropic etch, or a combination thereof in order to form sidewall spacers 22.

Figure 9:
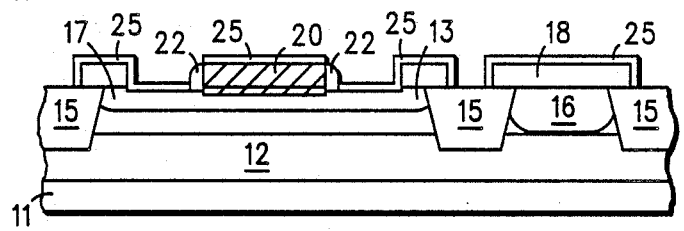

FIG. 9 illustrates the structure of FIG. 8 after a silicide layer 25 is formed. As can be seen in FIG. 9, and as is well known in the art, silicide 25 is formed only on silicon or polysilicon, therefore, silicide 25 forms self-aligned contacts to base regions 17, emitter region 20, and collector region 16. Platinum, titanium, cobalt, and the like, may be used to form silicide layer 25. In a preferred embodiment, titanium silicide is formed. The use of silicon dioxide sidewall spacers and silicide contacts allow for a reduction in the base resistance and the basecollector capacitance. Subsequent processing is standard in the art, thus will not be further illustrated.

Figure 10:
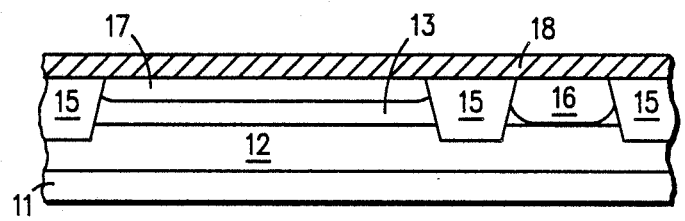
FIGS. 10-13 illustrate enlarged, cross-sectional views of a bipolar device during various stages of fabrication using a second embodiment of the present invention.
Figure 11:
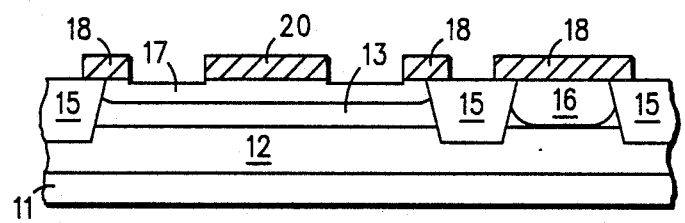

Referring to FIGS. 10-13, a second embodiment of the present invention is illustrated. The same reference numerals will be used for analogous parts. FIG. 10 illustrates the structure of FIG. 3 after a polysilicon layer 18 is deposited. In a preferred embodiment, an N-type dopant is implanted into polysilicon layer 18. Alternatively, polysilicon layer 18 may be doped during the deposition of polysilicon. Note that a masking layer will not be required here because polysilicon layer 18 is not selectively doped. It may be desirable to mask polysilicon 18 as in FIG. 4. FIG. 11 illustrates the structure of FIG. 10 after a portion of polysilicon layer 18 is removed by photolithography and etch techniques. A portion of polysilicon layer 18 that remains, which is referenced by the numeral 20, acts as an emitter region 20. The rest of the polysilicon will still be referenced by the numeral 18.

Figure 12:
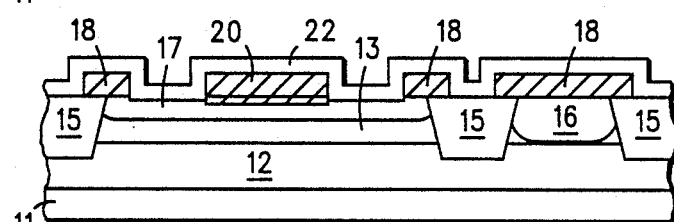

FIG. 12 illustrates the structure of FIG. 11 after a conformal silicon dioxide layer 22 is deposited on the surface of device 10. In order to improve the uniformity of oxide layer 22, it may be desirable to grow a thin silicon dioxide layer (not illustrated) by dry thermal oxidation before conformal layer 22 is deposited. Since silicon dioxide layer 22 is deposited and not grown, it is the same thickness everywhere on the surface of device 10. The thickness of silicon dioxide layer 22 is preferably approximately 1000 to 4000 angstroms. As is the first embodiment, an anneal is performed to drive the arsenic dopant located in emitter region 20 into base region 17.

Figure 13:
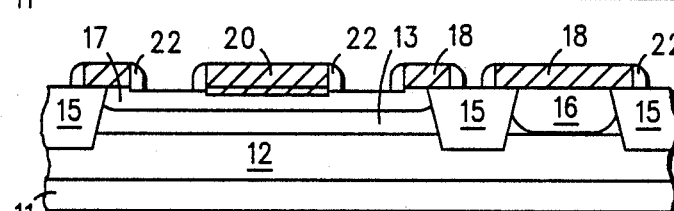

FIG. 13 illustrates the structure of FIG. 12 after silicon dioxide layer 22 is etched anisotropically to form spacers 22. The difference here is that silicon dioxide sidewall spacers 22 remain adjacent to polysilicon layers 18, as well as polysilicon emitter 20. It may be desirable to remove spacers 22 which are adjacent to polysilicon layers 18 over base region 17 if necessary to reduce the base resistance. Note that if sidewall spacers 22 which are adjacent to polysilicon layer 18 are removed, the structure of FIG. 13 would be similar to the structure of FIG. 8 except that polysilicon layer 18 is doped. In addition, an extrinsic base 23 may also be formed (not shown) before or after silicon dioxide layer 22 is etched.

Figure 14:
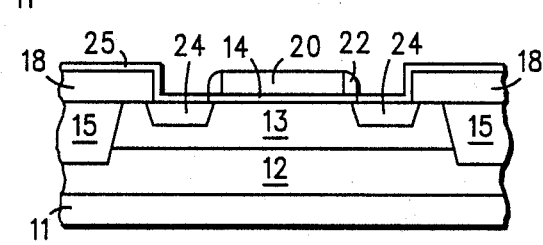
FIG. 14 illustrates an enlarged, cross-sectional view of an MOS device fabricated using the present invention.

FIG. 14 illustrates a P-channel MOS device 30 that is fabricated with the method of the present invention. The same reference numerals are used for analogous parts. Note that since the symmetrical bipolar structure 10 is similar to MOS structure 30 shown, the devices are easily integrated. Illustrated in MOS structure 30 is a gate region 20, a gate dielectric region 14, and source and drain regions 24. Gate dielectric region 14 is formed prior to depositing polysilicon layer 18. Source/drain regions 24 are formed by an additional ion implantation of a P-type conductivity dopant prior to forming the silicon dioxide for sidewall spacers 22. The other steps are common with the method of fabricating bipolar device structure 10. Although a description of a P-channel device has been provided, N-channel MOS devices may also be fabricated by using dopants of an opposite conductivity type. MOS structure 30 provides for reduced source/drain capacitance, and a planarized contact structure, among other things.

By now it should be appreciated that there has been provided a new and improved method of fabricating a high performance bipolar device that is compatible with a method of fabricating an MOS device.

We claim:
1. A method of fabricating a bipolar device integrated with an MOS device, comprising the steps of:
 providing a semiconductor substrate having at least a first and a second isolated region;
 forming a gate dielectric layer over the first isolated region;
 forming an intrinsic base region in the second isolated region;
 depositing a polysilicon layer on the surface of the substrate;
 doping a predetermined region of the polysilicon layer which defines a polysilicon emitter region and a polysilicon gate region;
 removing portions of the polysilicon layer adjacent to the polysilicon emitter region and adjacent to the polysilicon gate region;
 forming a source and a drain region in the substrate adjacent to the polysilicon gate region;
 growing a silicon dioxide layer on the surface of the polysilicon layer and the semiconductor substrate surfacer, wherein a thicker amount of silicon diox- ide grows over the polysilicon emitter region and the polysilicon gate region;

etching the silicon dioxide layer so that only a portion of the silicon dioxide which is adjacent to the polysilicon gate region and the polysilicon emitter region remains, thereby creating silicon dioxide sidewall spacers; and forming a silicide layer on the polysilicon layer, the polysilicon emitter region, and the semiconductor substrate surface, wherein the silicide forms self-aligned contacts to the intrinsic base regions, the polysilicon emitter region, the source and drain regions, and the polysilicon gate region.

2. The method of claim 1 further comprising the step of forming an extrinsic base in the substrate adjacent to the polysilicon emitter region after etching the silicon dioxide layer.

3. The method of claim 1 further comprising the step of forming an extrinsic base in the substrate adjacent to the polysilicon emitter region before etching the silicon dioxide layer.

* * * * *